US011828866B2

(12) United States Patent
Czarnecky et al.

(10) Patent No.: US 11,828,866 B2
(45) Date of Patent: Nov. 28, 2023

(54) SYSTEMS AND METHODS OF TRACKING OBJECTS

(71) Applicant: Pinpoint Ideas, LLC, Knoxville, TN (US)

(72) Inventors: Joseph Anthony Czarnecky, Okauchee, WI (US); Steven Andrew Rook, Cary, IL (US); Scott Allen Crutchfield, Louisville, TN (US); Gregory Parker Stair, Knoxville, TN (US)

(73) Assignee: PINPOINT IDEAS, LLC, Knoxville, TN (US)

( * ) Notice: Subject to any disclaimer, the term of this patent is extended or adjusted under 35 U.S.C. 154(b) by 0 days.

(21) Appl. No.: 18/074,940

(22) Filed: Dec. 5, 2022

(65) Prior Publication Data

US 2023/0100210 A1 Mar. 30, 2023

Related U.S. Application Data

(63) Continuation of application No. 16/856,272, filed on Apr. 23, 2020, now Pat. No. 11,520,000.

(51) Int. Cl.
| | |
|---|---|
| *G01S 5/06* | (2006.01) |
| *G01S 19/01* | (2010.01) |
| *G01P 15/00* | (2006.01) |
| *G01R 31/382* | (2019.01) |
| *G01P 13/00* | (2006.01) |
| *G01R 31/36* | (2020.01) |

(52) U.S. Cl.
CPC ................ *G01S 5/06* (2013.01); *G01P 13/00* (2013.01); *G01P 15/00* (2013.01); *G01R 31/3646* (2019.01); *G01R 31/382* (2019.01); *G01S 19/01* (2013.01)

(58) Field of Classification Search
CPC . G01S 5/06; G01S 19/01; G01P 13/00; G01P 15/00; G01R 31/3646; G01R 31/382
See application file for complete search history.

(56) References Cited

U.S. PATENT DOCUMENTS

| | | | |
|---|---|---|---|
| 9,253,752 | B2 | 2/2016 | Lee |
| 9,427,189 | B2 | 8/2016 | Proud |
| | | (Continued) | |

FOREIGN PATENT DOCUMENTS

| | | |
|---|---|---|
| CN | 202232511 U | 5/2012 |
| CN | 105190626 A | 12/2015 |
| | (Continued) | |

*Primary Examiner* — Elias Desta
(74) *Attorney, Agent, or Firm* — Pitts Lake, LLC

(57) ABSTRACT

Systems and methods of tracking attributes of objects, including a sensor configured to detect data related to one or more attributes of the object, a tracking device attachable to the object to transmit data detected by the sensor, a software application modifiable by a user, the software application being configured to receive transmitted data from the tracking device, firmware within a chip on the tracking device configured to determine a frequency of data transmissions from the tracking device to the software application based on transmission rules related to characteristics of transmitted data, and a display configured to show the frequency of data transmissions from the tracking device to the software application.

28 Claims, 5 Drawing Sheets

(56) References Cited

U.S. PATENT DOCUMENTS

| | | | |
|---|---|---|---|
| 9,599,632 B2* | 3/2017 | Yuen | G01P 15/14 |
| 9,756,459 B1 | 9/2017 | Walters | |
| 10,830,606 B2* | 11/2020 | Chang | G06V 40/25 |
| 11,520,000 B2* | 12/2022 | Czarnecky | G01P 15/00 |
| 2012/0009943 A1 | 1/2012 | Greenberg | |
| 2014/0062695 A1 | 3/2014 | Rosen et al. | |
| 2015/0282457 A1 | 10/2015 | Yarden | |
| 2015/0289789 A1 | 10/2015 | Peyser | |
| 2015/0356861 A1 | 12/2015 | Daoura | |
| 2015/0356862 A1 | 12/2015 | Daoura | |
| 2016/0105868 A1 | 4/2016 | Lee | |
| 2016/0106350 A1 | 4/2016 | Bhavaraju | |
| 2016/0113557 A1 | 4/2016 | Bhavaraju | |
| 2016/0113558 A1 | 4/2016 | Bhavaraju | |
| 2016/0129960 A1 | 5/2016 | Akins | |
| 2016/0178392 A1 | 6/2016 | Goldfain | |
| 2016/0239794 A9 | 8/2016 | Shafer | |
| 2016/0282899 A1 | 9/2016 | Inagaki | |
| 2016/0283086 A1 | 9/2016 | Inagaki | |
| 2016/0299526 A1 | 10/2016 | Inagaki | |
| 2016/0327987 A1 | 11/2016 | Huitema | |
| 2017/0006834 A1 | 1/2017 | Waters | |
| 2017/0172472 A1 | 6/2017 | Wedekind | |
| 2017/0172473 A1 | 6/2017 | Wedekind | |
| 2018/0176729 A1 | 6/2018 | Mycek et al. | |
| 2018/0368068 A1 | 12/2018 | Deorah et al. | |
| 2020/0158810 A1* | 5/2020 | Zhang | G01S 5/0278 |

FOREIGN PATENT DOCUMENTS

| | | |
|---|---|---|
| CN | 105208933 A | 12/2015 |
| CN | 105210070 A | 12/2015 |
| CN | 105229650 A | 1/2016 |
| CN | 105342576 A | 2/2016 |
| CN | 105425904 A | 3/2016 |
| CN | 205121417 U | 3/2016 |
| CN | 205250095 U | 5/2016 |
| CN | 105613334 A | 6/2016 |
| CN | 105705078 A | 6/2016 |
| CN | 105940420 A | 9/2016 |
| DE | 102017105243 A1 | 9/2017 |
| EP | 2305108 B1 | 10/2016 |
| JP | 2016202149 A | 12/2016 |
| KR | 1020160102296 A | 8/2016 |
| KR | 1020160102297 A | 8/2016 |
| TW | 201507434 A | 2/2015 |
| TW | 201725559 A | 7/2017 |

* cited by examiner

SYSTEMS AND METHODS OF TRACKING OBJECTS

CROSS-REFERENCE TO RELATED APPLICATIONS

This application is a continuation of U.S. application Ser. No. 16/856,272, filed on Apr. 23, 2020, the contents of which are hereby incorporated by reference herein in their entirety.

BACKGROUND

Tracking the location and movement of pets, children and other precious or valuable assets has been a significant concern for many. For example, pets will frequently travel beyond the boundaries of their owner's home or property or otherwise need to be located. When unrestrained, these animals may wander away without the knowledge of their owner, and are liable to become temporarily lost, permanently lost, or even injured. Similarly, marine, powersports, and RV's, and other assets are relatively costly items and many of these assets are not shipped with batteries onboard. Manufacturers and dealers will want to track these assets to maintain data regarding their inventory composition and to provide valuable marketing data such as time and location of sales and delivery.

Tracking devices relying on battery power will have to be cognizant of power demands in order to maximize the battery recharge cycles. The battery recharge or replacement cycle will depend on how often the tracking device reports the location of the asset while in various modes. For example, where the asset is located within a physically constrained area or within a geofence location, then a limited number of transmissions would be acceptable since the position of the asset is generally known, and in the case of objects, there would be little to no movement within these regions. On the other hand, where the asset is outside of the geofence, then a higher frequency of transmissions will be necessary to determine position.

Known tracking systems have been less than satisfactory in providing the user the ability to view the power remaining for a particular mode and provide an ability to switch modes and vary the frequency of transmissions. Improvement is desired in order to facilitate improved battery life.

SUMMARY OF THE INVENTION

Example embodiments of the present general inventive concept can provide a system for tracking attributes of objects, including a sensor configured to detect data related to one or more attributes of the object, a tracking device attachable to the object to transmit data detected by the sensor, a software application modifiable by a user, the software application being configured to receive transmitted data from the tracking device, firmware within a chip on the tracking device configured to determine a frequency of data transmissions from the tracking device to the software application based on transmission rules related to characteristics of transmitted data, and a display configured to show the frequency of data transmissions from the tracking device to the software application.

Example embodiments of the present general inventive concept can also provide a system for tracking location and/or movement of objects, including a tracking device attachable to the object to transmit location and/or movement data of the object, a sensor configured to determine whether the tracking device is moving or stationary, a battery configured to power the tracking device, a software application modifiable by a user, the software application being configured to receive transmitted location and/or movement data from the tracking device, firmware within a chip on the tracking device configured to determine a frequency of data transmissions from the tracking device to the software application based on transmission rules related to characteristics of transmitted location and/or movement data, and a display configured to show a level of battery life and the frequency of data transmissions from the tracking device to the software application.

Embodiments of the present general inventive concept can also provide a pet, child, power sport, recreational vehicle or other asset system for tracking with extended battery life comprising: a tracking device with internal battery supply, attached to the pet, child, power sport, recreational vehicle or other asset; a software application that may be modified by a user and determines a frequency of data transmissions required as the pet, child, power sport, recreational vehicle or other asset moves among locations, and collects the data that the tracking device sends through a Blue Tooth, WIFI, or cellular connection; firmware within a chip on the tracking device that determines how often data is sent from the tracking device to the software application; a display that shows the frequency mode of the tracking device and an amount of battery life remaining on the internal battery; and a sensor attached to the tracking device that determines whether the tracking device is moving or stationary.

Example embodiments of the present general inventive concept can also be achieved by providing a pet, child, power sport, recreational vehicle or other asset method for tracking with extended battery life comprising: attaching a tracking device with internal battery supply to the pet, child, power sport, recreational vehicle or other asset; providing a software application that determines a frequency of data transmissions required of the tracking device as the pet, child, power sport, recreational vehicle or other asset moves among locations; providing a display screen that shows the frequency mode of the tracking device and an amount of battery life remaining on the internal battery; detecting the presence of geofence boundary by comparing location data against map data; and modifying a number and frequency of data transmissions provided by the tracking device based on the presence of a geofence, movement of the tracking device and location of the tracking device.

BRIEF DESCRIPTION OF THE DRAWINGS

Example embodiments of the present general inventive concept will become more clearly understood from the following detailed description of the present general inventive concept read together with the drawings in which.

DETAILED DESCRIPTION

Figure 1:
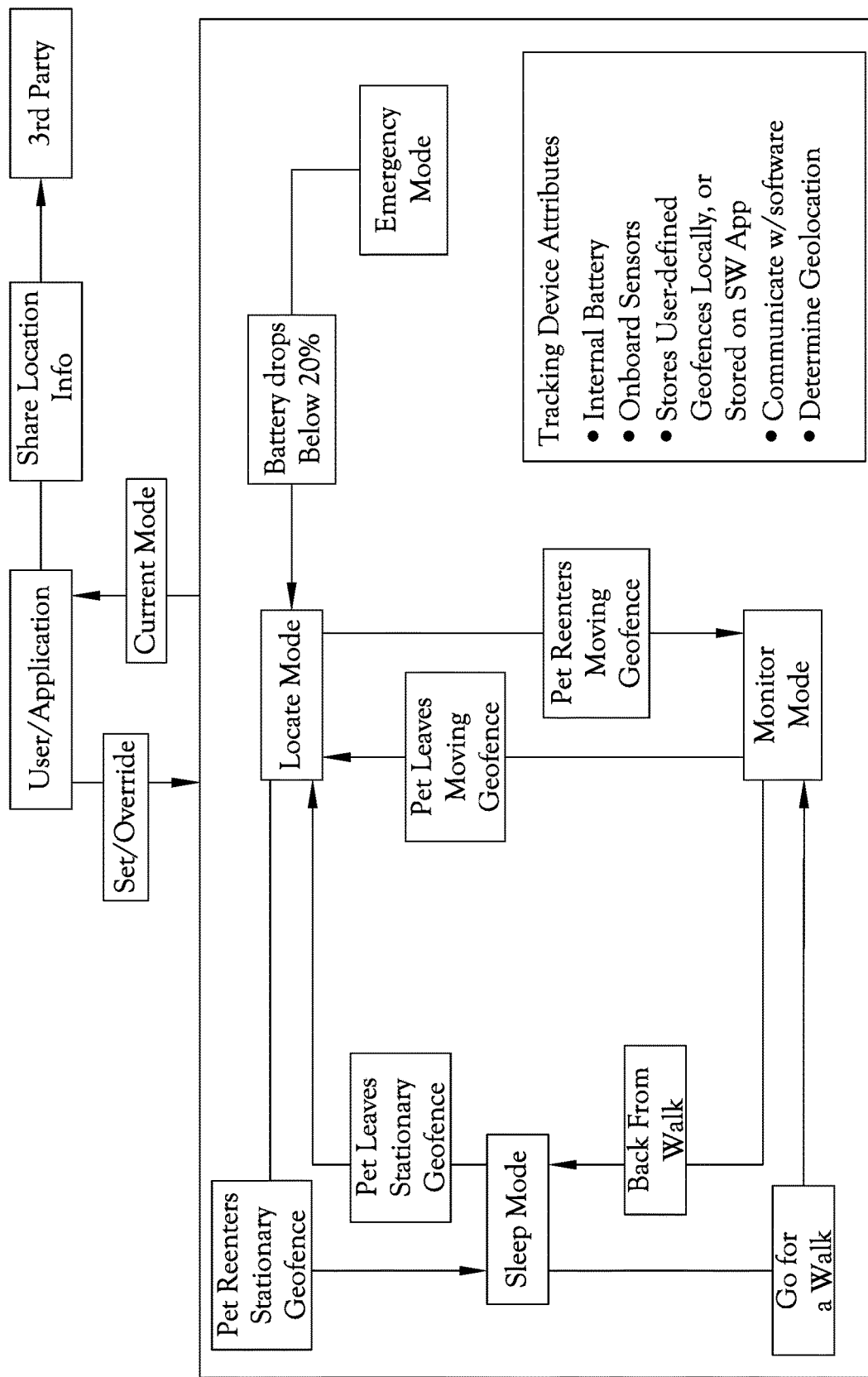
FIG. 1 illustrates a top level view of the tracking device and system according to an example embodiment of the present general inventive concept.

Reference will now be made to the example embodiments of the present general inventive concept, examples of which are illustrated in the accompanying drawing(s) and illustration(s). The example embodiments are described herein in order to explain the present general inventive concept by referring to the figure(s). The following detailed description is provided to assist the reader in gaining a comprehensive understanding of the structures described herein. Accordingly, various changes, modification, and equivalents of the structures and techniques described herein will be suggested to those of ordinary skill in the art. The descriptions are merely examples, however, and the sequence type of operations is not limited to that set forth herein and may be changed as is known in the art, with the exception of operations necessarily occurring in a certain order. Also, description of well-known functions and constructions may be omitted for increased clarity and conciseness This invention includes a screen on the device or display screen running on the software application, or a separate screen that the device can connect to, or a combination thereof, that displays the mode of the tracking device. The device modes may include, but are not limited to: 1. sleep mode, 2. monitor mode, 3. locate mode, and 4. emergency mode. Each mode represents a frequency of pings and which can be changed by the software developer or by the consumer in their software application. The sleep mode will be the fewest frequency pings and may be the mode in which the tracking device is operating while it is in a geofence. Monitor mode will be a higher frequency of pings and a locate mode may be yet a further increased number of transmissions per given time interval. The emergency mode will be entered when, for example, the pet is outside of the geofence and the owner is needing to receive an intense number of transmissions to assure proper location, especially if the pet or other asset is moving.

An example of a readout might be as follows:

| Sleep mode | 9 days battery life left |
| --- | --- |
| Monitor mode | 5 days |
| Locate mode | 1 day |
| Emergency mode | 4 hours |

It is envisioned that a charge will may be made to the customer to enable more frequent transmissions and a readout showing the mode and battery life left, and that the revenues derived from the customer, and in the case where the tracking device is used for pets, may be shared with the pet store. The user or multiple users will be able to know the battery life remaining in any of the modes. They will be able to switch to any of the modes and know the battery life left in the selected mode. This increases or decreases the remainder of the battery life. The user will also be able to enter into a specific mode and change the frequency of transmissions to assist in location and tracking and know the battery life based on the frequency of transmissions they have set the software application and tracking device to. The software application will communicate with the tracking device to change the frequency of the transmissions.

Sleep mode is implemented when the tracked object is inside a defined geofence or within another physically enclosed location. In that case, according to one embodiment of the invention, the tracking device will be connected by Bluetooth or WIFI. In one embodiment, priority will be given to Bluetooth first, WIFI second, cellular third, and GPS fourth. Thus, in the sleep mode, the cellular connection will likely be sleeping, and the power consumption will be based on the amount of power consumed by the Bluetooth connection or WIFI. Only sensor data is being collected in this mode, in order to determine if there has been movement by the tracked object outside of the defined geofence or within another physically enclosed location, and will be transmitted at predetermined intervals to the receiving platform via the Bluetooth or WIFI connection. The system may detect the presence of a geofence boundary by comparing location data against known map data. Motion detection may be accomplished by use of an accelerometer or gyroscope. Other sensors which may be used include, but are not limited to, an altitude sensor, temperature sensor, or magnetometer.

FIG. 1 illustrates a depiction of the overall system concept. A user via a software application is able to set or override current mode and set the ping frequency. The user can also view in the software application the current mode and remaining battery life info based on the current mode. The user may also be able to share location information with third parties. The various mode attributes are shown in the figure. In Sleep mode, the tracking device is inside a defined stationary geofence. This mode has the lowest frequency ping rate and the longest battery life and uses local geofence information to determine if the tracking device leaves the geofence. In Locate mode, the tracking device is outside of all defined geofences. This mode has the second highest ping rate and the second shortest battery life. In Monitor mode, the tracking device is inside a moving geofence. It has the second lowest frequency rate and the second longest battery life. Location data is sent to the software application when movement stops or stops. The user chooses Emergency on the tracking device, and this mode has the highest frequency ping rate and the shortest battery life.

The tracking device attributes include an internal battery supply and onboard sensors including accelerometer, altimeter, thermometer and others. The tracking device stores user defined geofences locally, although the geofences can also be stored on the software application, and communicates with the software application via the protocol which provides the least drain on the battery. Similarly, the tracking device determines geolocation with the most battery-friendly approach from GPS, Triangulation using WIFI, Triangulation using cellular, or provided by another device that the tracking device is paired with via Bluetooth.

Figure 2:
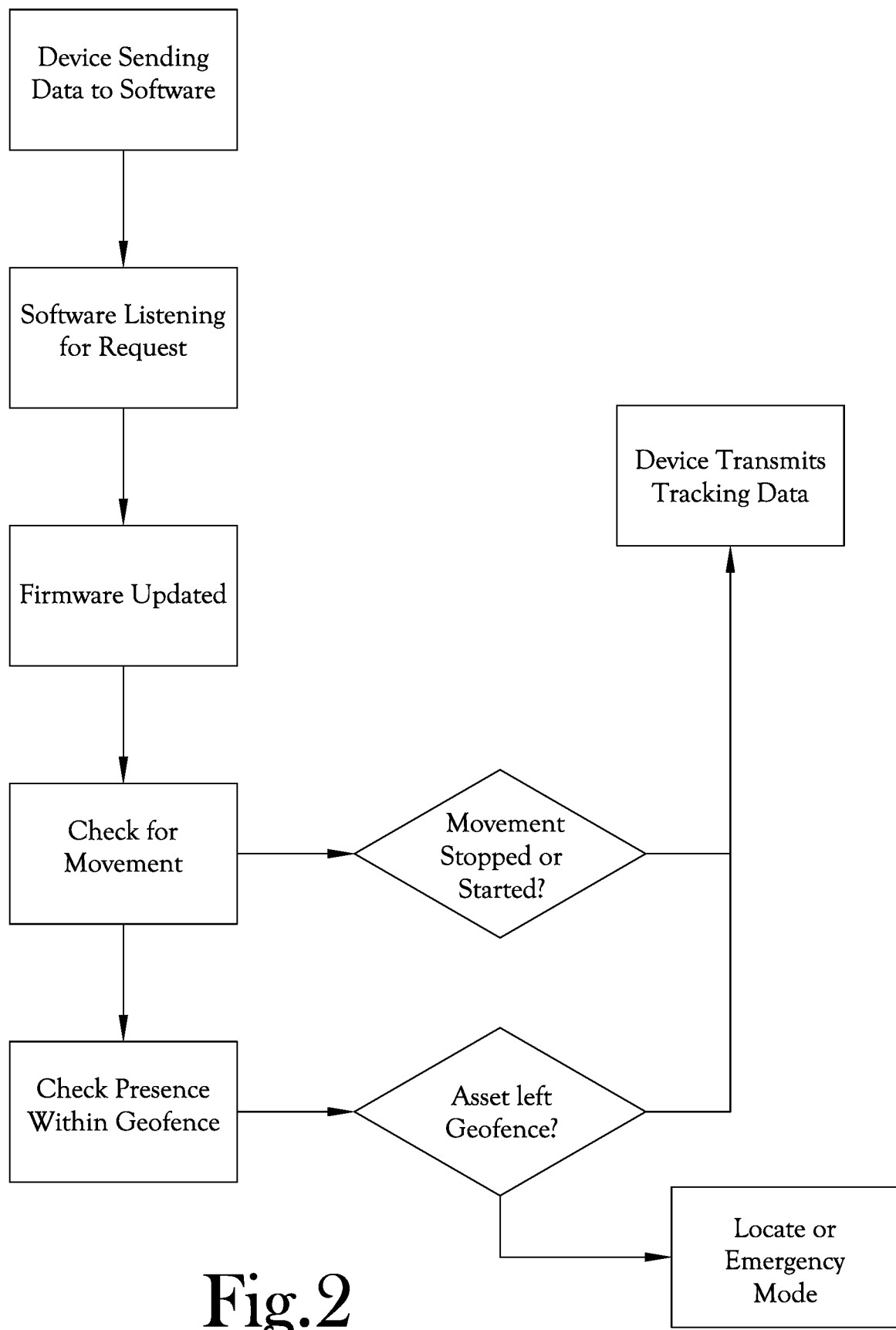
FIG. 2 is a flow diagram showing the stages of the process while the tracking device is in sleep mode according to an example embodiment of the present general inventive concept.

FIG. 2 represents the stages of the process while the tracking device is in the Sleep mode. Since the tracking device will be located within a geofence during this step, only minimal transmission will be required. In the first step shown, the tracking device is sending data to the software application at a rate controlled by instructions from the firmware within the chip on the tracking device. While the tracking device is sending data, the software application listens for requests for position data transmissions from the tracking device. Additionally, the firmware in the tracking device can be updated by the software application so that the firmware is set to send the data in different intervals based on the location, activity and sensors on the tracking device. Next, the tracking device checks for movement using an accelerometer. If the tracking device detects that movement has stopped or started, the tracking device transmits tracking information. Finally, the tracking device checks the presence of the tracking device within a geofence. If the tracking device has left the geofence, then the tracking device transmits tracking information and the mode changes to Locate mode, or Emergency mode if activated by the device owner, or for example by the pet owner, parent, caregiver, or other user. If the tracking device determines that it is still within the geofence then the process repeats itself within a loop.

Location may be based on the geolocation of the WIFI. For example, the first step in determining a tracking device's position may be to determine the distance between the target client tracking device and a couple of access points. With the distances between the target device and access points known, trilateration algorithms may then be used to determine the relative position of the target device, and using as a reference the known position of access points. In another embodiment, the angle of arriving signals at a target client device may be employed to determine the tracking device's location based on triangulation algorithms. Various combination of these approaches may be used to increase the accuracy of the system. Location may also be based on the location of a Bluetooth compliant tracking device, for example a smartphone, which is coupled with the tracking device.

Monitor mode is associated with a moving geofence, for example a moving location that is associated with some portable electronic device. The tracking device may be in monitor mode while walking or driving. While in monitor mode, the tracking device will transmit data slightly more frequently than it would while in the Sleep mode. In this case, the tracking device may be paired with a smartphone running the appropriate application. Power consumption therefore will be based on the Bluetooth connection. Both sensor and location data may be collected, and can be transmitted at predetermined intervals to the platform via Bluetooth or WIFI. Location of the tracking device will be based on the geolocation of the WIFI or based on the location of the smartphone coupled to the tracking device. In the case where the Bluetooth connection is not available, the tracking device will automatically go into locate mode, as described below, since it will no longer be within the moving geofence, and will also be outside of a static geofence. Once the tracking device is located, if it is found to be within a geofence once again, the mode will change back to the Sleep mode.

Figure 3:
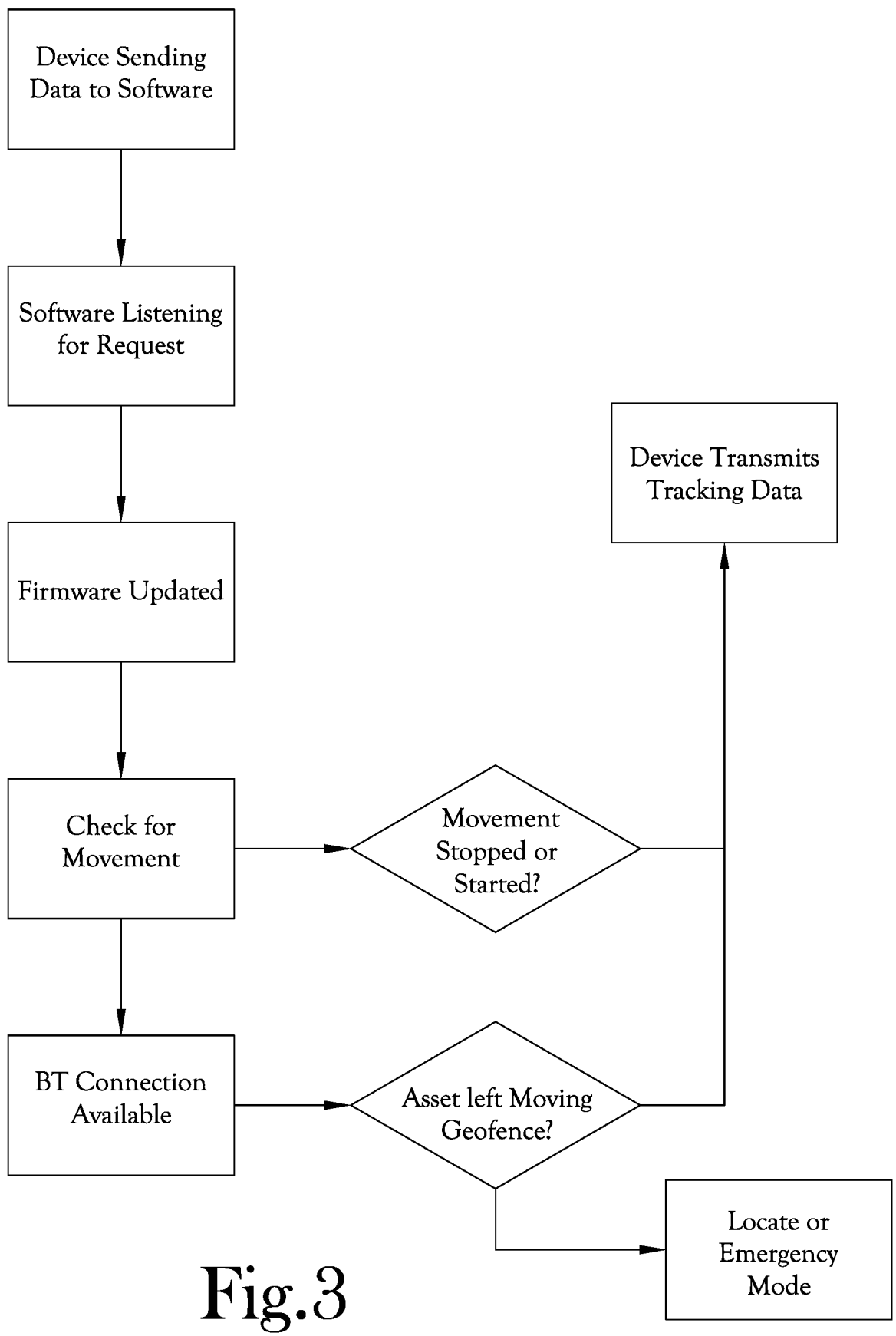
FIG. 3 is a flow diagram showing the stages of the process while the tracking device is in monitor mode according to an example embodiment of the present general inventive concept.

FIG. 3 represents the stages of the process while the tracking device is in the Monitor mode. Since the tracking device will be located within a moving geofence during this step, more transmission will be required than in Sleep mode. In the first step shown, the tracking device is sending data to the software application at a rate controlled by instructions from the firmware within the chip on the tracking device. While the tracking device is sending data, the software application listens for requests for position data transmissions from the tracking device. Additionally, the firmware in the tracking device can be updated by the software application so that the firmware is set to send the data in different intervals based on the location, activity and sensors on the tracking device. Next, the tracking device checks for movement using an accelerometer. If the tracking device detects that movement has stopped or started, the tracking device transmits tracking information. Finally, the system determines whether a Bluetooth connection is still available. If there is no longer a Bluetooth connection, then the tracking device has left the moving geofence, the tracking device transmits tracking information, and the mode changes to Locate mode, or Emergency mode if activated through the software application by the device owner, or for example by the pet owner, parent, caregiver, or other user. If the tracking device determines that it is still within the moving geofence then the process repeats itself within a loop.

Locate mode may be implemented when the tracking device is outside a defined geofence. In this case, routes may be recorded, and the tracking device transmits data more frequently than it would while in Monitor mode. Giving priority to Bluetooth first, WIFI second, Cellular third, and GPS last, there are several different scenarios which may arise, and are each described below.

If the tracking device is paired with a Bluetooth compatible smartphone running the appropriate application, the mode will be changed to Monitor mode as described in a paragraph above. The tracking device will transmit data slightly more frequently than it would while in the Sleep mode and power consumption will be based on the Bluetooth connection If the tracking device is on a WIFI network, location will be transmitted based on a WIFI crowdsourced location engine. The frequency of transmission can be defined by the user in a range between a minimum and a maximum, for example from every five minutes to once per hour and it will be over a cellular radio, since it will not be able to rely on being connected within the WIFI network. Finally, if the tracking device is not on either Bluetooth or WIFI, a location fix with assisted location will be performed, for example by using cell tower triangulation. This will be performed at a frequency that can be defined by the user in a range between a minimum and a maximum, for example from every five minutes to once per hour, using the cellular network, and transmitted to the platform. In addition to the cellular location approach, a GPS tracking fix may also be performed every fifth, or other specified, interval, in order to increase the accuracy of the trail. However, the GPS tracking fix may only be considered necessary if the tracking device is determined to be on the move.

Figure 4:
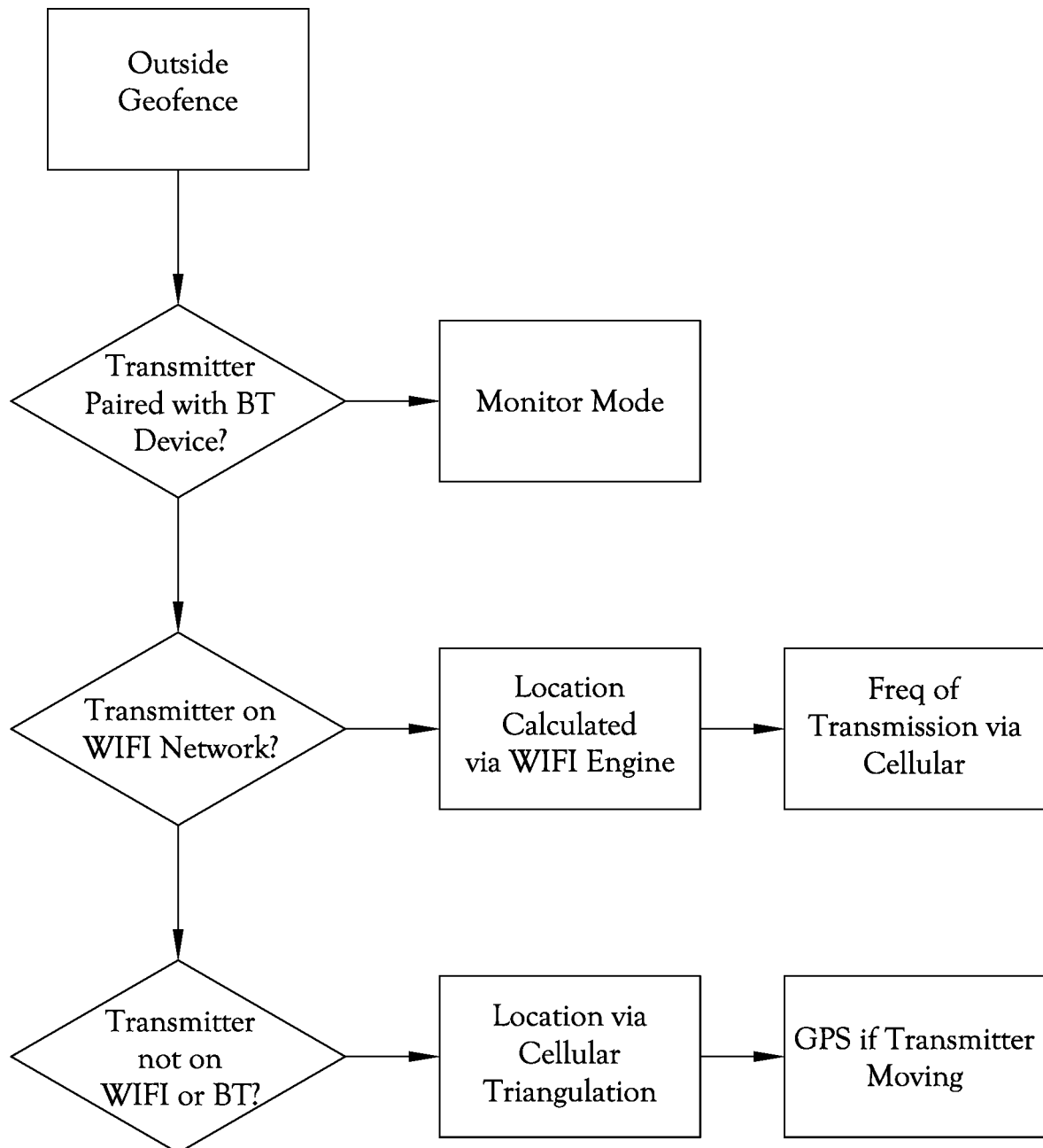
FIG. 4 is a flow diagram showing the stages of the process while the tracking device is in locate mode according to an example embodiment of the present general inventive concept.

FIG. 4 represents the stages of the process while the tracking device is in the Locate mode. The flow diagram starts with the tracked object outside of a defined geofence. If the transmitter is paired with a Bluetooth device, then the tracking device goes into Monitor mode. If the transmitter is on a WIFI network, then location data will be calculated based on a crowdsourced WIFI engine and transmitted. The frequency of transmission will be transmitted by cellular radio. If the transmitter is not on WIFI or Bluetooth, then location will be calculated based on cellular tower triangulation, at a frequency defined by the user. Finally, if the transmitter is moving, then a GPS fix will also be performed.

Emergency mode may be activated by the tracking device owner, or for example by the pet owner, parent, caregiver, or other user. In Emergency mode, the tracking device will be outside a geofence or the tracking device will be lost. In this case, in order to ascertain proper location, especially if the asset is moving, the frequency of transmissions will be increased to a maximum level. For example, transmissions will be performed every thirty to sixty seconds. In this mode, the cellular radio will be in listening mode and the location is being collected and transmitted. Given the number of transmissions, this mode will be the most power consuming of those described. Thus, it will be necessary to monitor the battery life to ensure that the tracking device will be able to continue to transmit data. When the battery reaches a predetermined level, for example 20%, the tracking device will switch to Locate mode.

Figure 5:
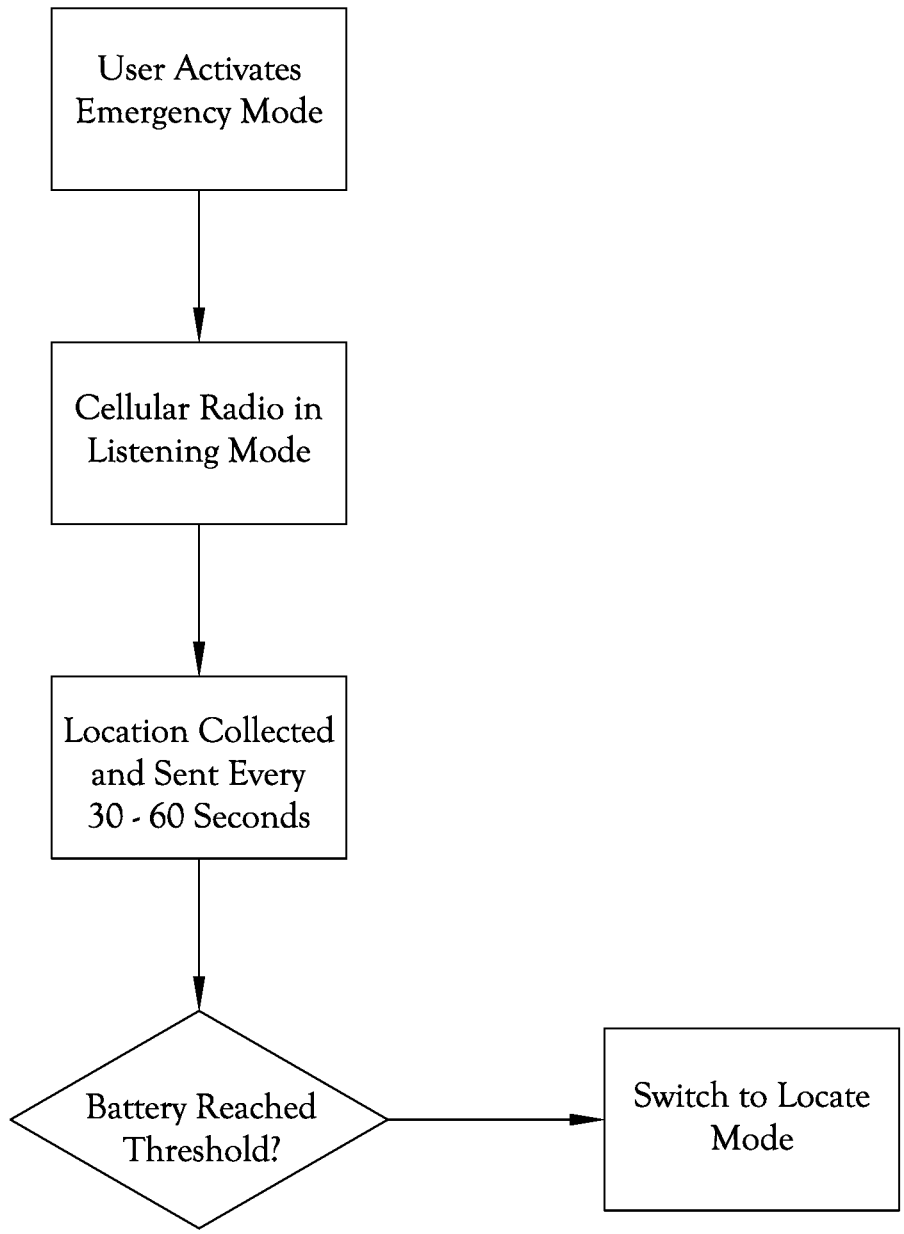
FIG. 5 is a flow diagram showing the stages of the process while the tracking device is in emergency mode according to an example embodiment of the present general inventive concept.

FIG. 5 represents the stages of the process while the tracking device is in the Emergency mode. The flow diagram illustrates a user initiating Emergency mode, for example when a pet or child is outside a defined geofence or when the pet or child has been lost. Since the power consumption is at its greatest, it will be necessary to monitor battery life when it reaches a depleted value. The cellular radio will be in listening mode and the location of the tracking device may be collected every 30 to 60 seconds, or other time frame specified by the user with the software application. A display showing the remaining battery life will be monitored by the user and when the battery reaches a specified threshold, for example 20%, the tracking device will switch back to Locate mode, in order to conserve battery life.

Some embodiments provide a tracking device with a screen that displays the mode of the tracking device on a screen. The device modes may include sleep mode, monitor mode, locate mode, and emergency mode. Each mode represents a frequency of transmission and which can be changed by the software developer or by the consumer in their software application. The sleep mode will be the fewest frequency pings and may be the mode in which the tracking device is operating while it is in a geofence. Monitor mode will be a higher frequency of pings and a locate mode may be yet a further increased number of pings per given time interval. The emergency mode will be entered when, for example, the pet is outside of the geofence and the owner needs to receive an intense number of pings to assure proper location, especially if the pet is moving. A charge may be made to the customer to enable readouts showing the mode and battery life left, and that the revenues derived from the customer, and in the case where the tracking device is used for pets, may be shared with the pet store. The user will be able to know the battery life remaining in any of the modes. The software application will communicate with the tracking device to change the frequency of the pings.

While the present general inventive concept has been illustrated by description of several example embodiments, and while the illustrative embodiments have been described in detail, it is not the intention of the applicant to restrict or in any way limit the scope of the general inventive concept to such descriptions and illustrations. Instead, the descriptions, drawings, and claims herein are to be regarded as illustrative in nature, and not as restrictive, and additional embodiments will readily appear to those skilled in the art upon reading the above description and drawings. Additional modifications will readily appear to those skilled in the art. Accordingly, departures may be made from such details without departing from the spirit or scope of applicant's general inventive concept.

The invention claimed is:

1. A system for tracking location and/or movement of objects, comprising:
    a tracking device attachable to the object to transmit location and/or movement data of the object;
    a sensor configured to determine whether the tracking device is moving or stationary;
    a battery configured to power the tracking device;
    a software application modifiable by a user, the software application being configured to receive transmitted location and/or movement data from the tracking device;
    firmware within a chip on the tracking device configured to determine a frequency of data transmissions from the tracking device to the software application based on transmission rules related to characteristics of transmitted location and/or movement data; and
    a display configured to show a level of battery life and the frequency of data transmissions from the tracking device to the software application.

2. The tracking system according to claim 1, wherein the tracking device sends the data through a Bluetooth, Satellite, WI FI, Cellular, RF, or other wireless connection.

3. The tracking system according to claim 1, wherein the tracking device transmits data to the software application according to a least battery consumptive protocol.

4. The tracking system according to claim 3, wherein the least battery consumptive protocol is based on whether the tracking device moving.

5. The tracking system according to claim 3, wherein the least battery consumptive protocol is based on location of the tracking device.

6. The tracking system according to claim 3, wherein the least battery consumptive protocol is based on triangulation technology provided by another device paired with the tracking device via a wireless connection.

7. The tracking system according to claim 3, wherein the tracking device determines geolocation of the object via the least battery consumptive protocol.

8. The tracking system according to claim 1, wherein the tracking device stores one or more geofences locally or in the software application.

9. The tracking system according to claim 8, wherein the transmission rules are based on whether the object is in or out of the one or more geofences.

10. The tracking system according to claim 1, wherein the transmission rules include one or more modes of operation.

11. The tracking system of according to claim 10, wherein the modes of operation include one or more of a sleep mode, locate mode, monitor mode, and emergency mode.

12. The tracking system of according to claim 10, wherein the display shows the user a current mode of operation.

13. The tracking system according to claim 12, wherein the display shows the user the level of battery life based on the current mode of operation.

14. The tracking system according to claim 1, wherein the sensor comprises an accelerometer.

15. The tracking system according to claim 1, wherein the software application shares received location and/or movement data with a third party.

16. The tracking system according to claim 1, wherein the software application is a cloud-based system.

17. The tracking system according to claim 1, wherein the software application is configured to enable the user to set the frequency of data transmission.

18. A method of tracking location and/or movement of an object, comprising:
    providing a tracking device to transmit location and/or movement data of the object;
    providing a sensor to determine whether the tracking device is moving or stationary;
    providing a software application to receive transmitted location and/or movement data from the tracking device;
    providing firmware within a chip of the tracking device to determine a frequency of data transmissions from the tracking device to the software application based on transmission rules related to characteristics of transmitted location and/or movement data; and modifying transmission rules provided to the firmware based on characteristics of transmitted location and/or movement data.

19. The method according to claim 18, further comprising:
detecting a level of battery life of a battery powering the tracking device; and
modifying the frequency of data transmissions based on the level of battery life.

20. The method according to claim 18, further comprising:
detecting the presence of one or more geofence boundaries by comparing location data to map data; and
modifying the frequency of data transmissions based on whether the object is in or out of the one or more geofence boundaries.

21. The method according to claim 18, wherein the software application is configured to allow a user to vary the frequency of data transmissions.

22. The method of claim 18, wherein the software application provides a user the ability to switch modes of operation between one or more of a sleep mode, locate mode, monitor mode, or emergency mode.

23. A system for tracking attributes of objects, comprising:
a sensor configured to detect data related to one or more attributes of the object;
a tracking device attachable to the object to transmit data detected by the sensor;
a software application modifiable by a user, the software application being configured to receive transmitted data from the tracking device;
firmware within a chip on the tracking device configured to determine a frequency of data transmissions from the tracking device to the software application based on transmission rules related to characteristics of transmitted data; and
a display configured to show the frequency of data transmissions from the tracking device to the software application.

24. The system of claim 23, wherein the transmission rules are modifiable by the user based on the characteristics of transmitted data.

25. The system of claim 23, further comprising:
a battery configured to power the tracking device,
wherein the sensor is configured to detect a level of battery life of the battery, and
wherein the transmission rules are based on the level of battery life of the battery.

26. The system of claim 23, wherein the sensor is configured to detect a temperature of the object, and wherein the transmission rules are based on the temperature of the object.

27. The system of claim 23, wherein the tracking device is configured to connect to a wireless network, and wherein the transmission rules are based on whether the tracking device is connected to the wireless network.

28. The system of claim 23, wherein the tracking device is configured to connect to a Bluetooth device, and wherein the transmission rules are based on whether the tracking device is connected to the Bluetooth device.

* * * * *